Jan. 9, 1951 W. H. BRATTAIN 2,537,255

LIGHT-SENSITIVE ELECTRIC DEVICE

Filed March 20, 1946 2 Sheets-Sheet 1

INVENTOR
W. H. BRATTAIN
BY
Stanley B. Kent
ATTORNEY

INVENTOR
W. H. BRATTAIN
BY
Stanley B. Kent
ATTORNEY

Patented Jan. 9, 1951 2,537,255

UNITED STATES PATENT OFFICE 2,537,255

LIGHT-SENSITIVE ELECTRIC DEVICE

Walter H. Brattain, Chatham, N. J., assignor to Bell Telephone Laboratories, Incorporated, New York, N. Y., a corporation of New York Application March 20, 1946, Serial No. 655,694

9 Claims. (Cl. 136—89)

This invention relates to light sensitive electric devices and more particularly to photo-E. M. F. cells comprising silicon and methods of making such devices.

An object of the invention is to provide an improved photo-E. M. F. cell comprising vapor deposited silicon.

Another object of the invention is to provide an improved method of making light sensitive electrical devices by the pyrolytic deposition of silicon.

In an example of practice of this invention, a photo-E. M. F. cell is formed by providing a layer of purified silicon on a tantalum wire of circular or rectangular cross-section by pyrolytic deposition from a gaseous mixture of hydrogen and silicon tetrachloride, depositing by vaporization a thin film of silicon on said layer and providing a metallic contact on a portion only of the surface of said film. Such contact may consist of a tungsten wire the end of which is firmly held against the thin film of silicon. The tantalum wire serves as the other contact member for such a cell.

In another example of practice of this invention, the first layer of purified silicon on the tantalum wire is coated with a film of silicon dioxide (quartz) which layer of quartz is then coated with a light transmitting film of vaporized tungsten on which another electrical contact is provided contacting portions only of the tungsten film.

The electrical contact applied to the film of vaporized silicon may be a so-called point contact of the kind mentioned above, but preferably it comprises a light transmitting film of a noble metal, such as platinum or gold, over which is applied an opaque metallic contact contacting only a small portion of the light transmitting film.

This invention will now be described more in detail having reference to the accompanying drawing.

Figure 1:
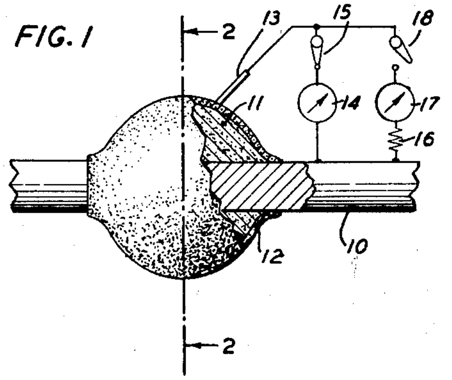
Figure 2:
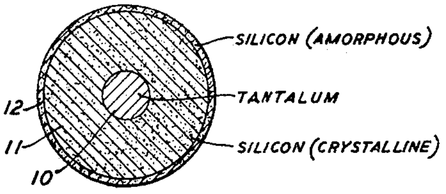
Figure 3:
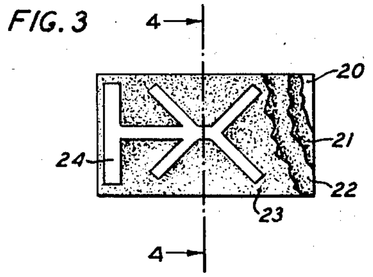
Figure 4:
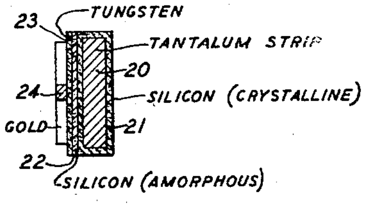
Figure 5:
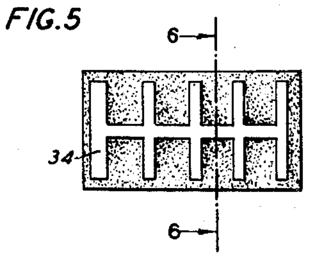
Figure 6:
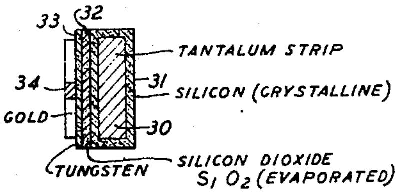
Figure 7:
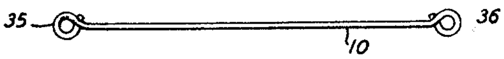
Figure 8:
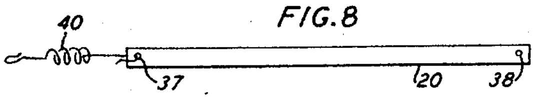
Figure 9:
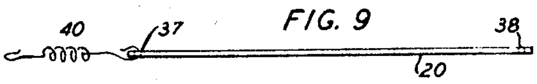
Figure 10:
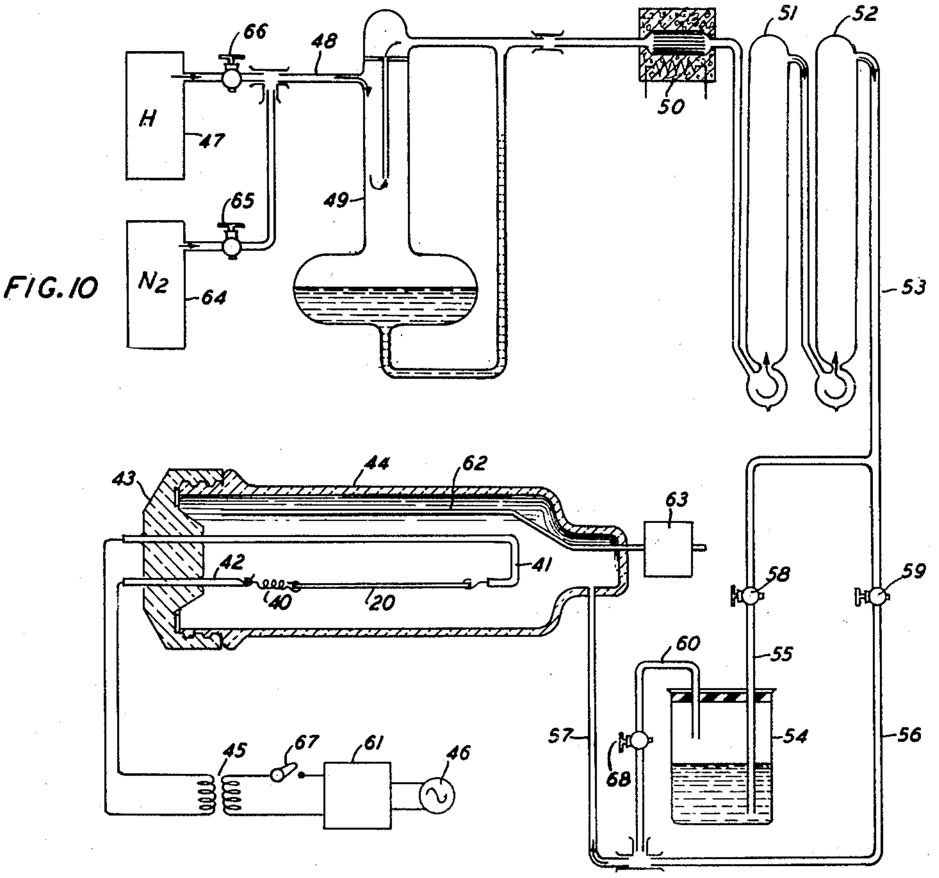
Figure 11:
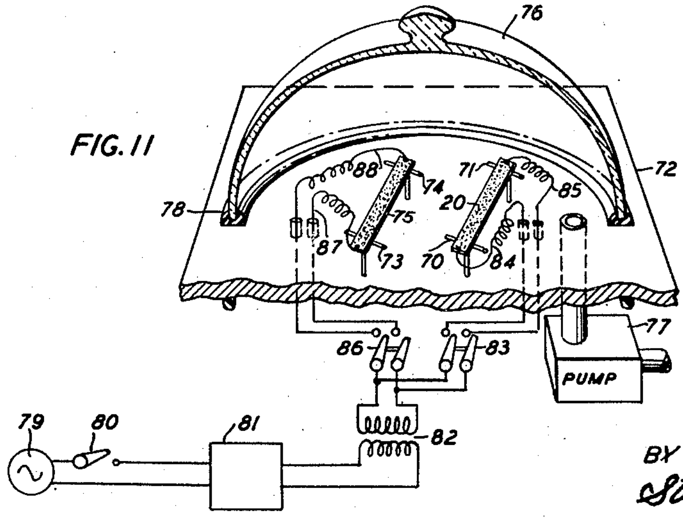

Fig. 1 shows a photo-E. M. F. cell, according to this invention;

Fig. 2 is a cross-section of the cell of Fig. 1, looking in the direction of the arrows 2;

Fig. 3 shows another form of photo-E. M. F. cell, according to this invention;

Fig. 4 is a cross-section of the cell of Fig. 3, looking in the direction of the arrows 4;

Fig. 5 shows still another form of photo-E. M. F. cell, according to this invention;

Fig. 6 is a cross-section of a cell of Fig. 5, looking in the direction of the arrows 6;

Fig. 7 shows a wire suitably formed for use in making a photo-E. M. F. cell of Figs. 1 and 2;

Figs. 8 and 9 show plan and side views, respectively, of a wire of rectangular cross-section suitable for use in making the photo-E. M. F. cells of Figs. 3 and 4 and Figs. 5 and 6;

Fig. 10 illustrates apparatus suitable for coating wires by pyrolytic deposition of silicon for use in photo-E. M. F. cells, according to this invention, and Fig. 11 illustrates apparatus for vaporizing and coating wires with silicon for photo-E. M. F. cells, according to this invention.

Like elements in the several figures of the drawing are designated by identical reference characters. The thickness of the films or layers and the dimensions of other elements are greatly exaggerated for clearness of illustration.

Referring now to Figs. 1 and 2 of the drawing, a photo-E. M. F. cell, according to this invention, comprises a tantalum wire 10 of circular cross-section on which is deposited a bead 11 of highly purified silicon. This bead of silicon has a crystalline structure. Overlying the bead 11 of silicon is a thin film or layer 12 of silicon deposited by the vaporization of purified silicon in a vacuum. The silicon of this layer 12 is believed to be amorphous in form. In order to complete the cell, contact is made to the surface of the film 12 by metallic wire 13, preferably of tungsten. Wire 13 may be supported out of contact with wire 10 by insulating supports (not shown) in any suitable manner. A voltmeter 14 may be connected between the wires 10 and 13 by switch 15 in order to indicate the electromotive force generated by the illumination of the layer or film 12. In order to utilize this generated voltage, a load circuit, such as resistor 16, in series with a milliammeter 17 may be connected by switch 18 between the wires 10 and 13. Tantalum has been found to serve well as a support for the silicon bead, but other metals may be used which do not alloy readily with silicon.

Referring now to Figs. 3 and 4, another form of photo-emf cell, according to this invention, comprises a tantalum wire 20 of rectangular cross-section coated with a layer 21 of highly purified silicon. Overlying the layer 21 on one flat surface, for example, is a thin film or layer 22 of silicon deposited by vaporization. Over the layer 22 of silicon is a light transmitting layer 23 of tungsten deposited by vaporization. On top of and in contact with the layer 23 is an electrode 24 of relatively thick metal, such as platinum or gold, so shaped as to cover a relatively small portion of the top surface of the layer 23 but still provide good conductive paths from practically all portions of the surface of layer 23.

Referring to Figs. 5 and 6, still another form of photo-emf cell, according to this invention, comprises a tantalum wire 30 of rectangular cross-section coated with a layer 31 of purified silicon. Overlying the layer 31 on one flat surface, for example, is a thin film or layer 32 of silicon dioxide ($SiO_2$) formed by vaporization in vacuum or in any other suitable manner. Overlying the film 32 is a thin light transmitting film or layer 33 of tungsten deposited by vaporization in a vacuum. On top of and in contact with the layer 33 is an electrode 34 of relatively thick metal, such as platinum or gold, similar to the electrode 24 of Figs. 3 and 4. A somewhat different shape is shown for electrode 34.

Other shapes of light transmitting electrodes may be used instead of electrodes 24 and 34 of Figs. 3 and 5, respectively. The layer 12 of Figs. 1 and 2 may be coated with a thin light transmitting layer of metal, such as tungsten, platinum or gold against which a contact like contact 13 is held. The tungsten layers 23 and 33 may be omitted. The electrodes 24 and 34 may consist advantageously of copper when the light transmitting layers 23 and 33 are used.

When a light transmitting film or layer of tungsten is used over the layer of vaporized silicon or silicon dioxide, optimum sensitivity is obtained if the thickness of the tungsten film is between 3 and 8 ten thousandths of a mil. A thickness of 0.0004 mil gives good results.

The bead 11 for the device of Figs. 1 and 2 and the coating layers 21 and 31 of the devices of Figs. 3 and 4 and Figs. 5 and 6, respectively, are formed preferably by the use of the apparatus of Fig. 10. A length of tantalum wire 10 is formed with loops 35 and 36, as illustrated in Fig. 7, for making the device of Figs. 1 and 2. For the devices of Figs. 3 and 4 and Figs. 5 and 6 a length of tantalum wire 20 of rectangular cross-section, which may be called a tantalum strip, is provided with holes 37 and 38 near its ends, as illustrated in Figs. 8 and 9. The use of such wire and strip will be described in connection with the apparatus of Fig. 10.

The forming of the layer 21 on strip 20 of Figs. 3 and 4 will first be described with reference to the apparatus of Fig. 10. The strip 20 of the desired metal, such as tantalum, is formed with requisite dimensions and is equipped with a small coil spring 40 which holds it taut when it is suspended between the terminal wires 41 and 42 of the reaction chamber. The terminal wires 41 and 42, which may be of tungsten or any other suitable conductor, are sealed into the head 43 of the reaction chamber 44, the head 43 and terminal wires 41 and 42 forming a unit. To facilitate the removal and replacement of this unit, the head 43 and the walls of the chamber 44 are provided with threaded areas. Terminals 41 and 42 are connected through a transformer 45 to a suitable source of current 46 which serves to heat the strip 20 to the required temperature.

The strip 20 is coated with the layer 21 by the pyrolytic deposition of silicon from a mixture of hydrogen and silicon tetrachloride. The hydrogen is derived from a supply tank 47 which is connected by way of feed tube 48 to a flowmeter 49. The purpose of the meter 49 is to maintain a uniform flow of gas under varying external conditions. The hydrogen gas, after passing through the regulating flowmeter 49, enters a deoxidizing furnace 50 for the purpose of removing any traces of free oxygen that may be mixed with the hydrogen gas. Upon leaving the furnace 50, the hydrogen and any water vapor that may be formed in the furnace enters drying towers 51 and 52. These towers remove all traces of water vapor and permit only the dry hydrogen to flow into the outlet pipe 53.

The silicon tetrachloride vapor which is to be mixed with hydrogen gas to form a gaseous mixture is derived from the vessel 54. The mixture is effected by directing pure hydrogen gas through an inlet pipe 55 into the liquid tetrachloride in the vessel 54. The concentration of the gaseous mixture may be regulated and controlled in any suitable manner so that the mixture entering the reaction chamber 44 has the proper ratio of hydrogen and silicon tetrachloride components. One method of obtaining the desired mixture is to divide the supply tube 53, as illustrated, leading one branch 55 into the vessel 54 and another branch 56 directly to the reaction chamber 44 by way of the inlet tube 57 and by equipping the branches 55 and 56 with valves 58 and 59, respectively, and regulating the flow. The hydrogen entering the liquid silicon tetrachloride by way of the branch 55 mixes with the silicon tetrachloride vapor and the mixture then passes through the outlet tube 60 and the common inlet tube 57 into the chamber 44.

The decomposition of the silicon tetrachloride within the reaction chamber 44 is effected by heating the suspended tantalum strip 20 to a predetermined temperature. This is accomplished by applying a regulated voltage from the source 46 to the terminal wires 41 and 42. Any suitable voltage control device 61 may be used and the temperature of the strip 20 may be determined by any well-known means, such as an optical pyrometer. As the silicon tetrachloride decomposes under the influence of the heated strip, it yields elemental silicon which deposits in a thin layer on the surface of the strip. The gaseous mixture within the chamber 44 is maintained in a uniform state by a scavenging outlet tube 62. If desired, an evacuating pump 63 may be used to expedite the removal of the unwanted products from the reaction chamber 44.

After the silicon layer has been formed on the strip 20, the temperature is raised to the melting point of silicon, following which the strip is permitted to cool to crystallize the fused silicon.

In coating the strip 20 in the apparatus above described, the strip 20 is first prepared and mounted between the terminals 41 and 42 within the reaction chamber 44. The chamber is now thoroughly flushed by passing a suitable gas, such as nitrogen, through it for a substantial interval of time. The nitrogen gas which is supplied from a tank 64 passes through the open valve 65, the flowmeter 49, furnace 50, drying towers 51 and 52 to the supply tube 53. During this cleansing interval the valve 58 in the branch 55 and the valve 68 in the outlet tube 60 are closed and the valve 59 in the by-pass branch 56 is open. The nitrogen gas flowing in the supply tube 53 passes through the by-pass branch 56 and through the inlet tube 57 into the reaction chamber 44 from which it finally emerges through the scavenging tube 62. After the chamber has been flushed with nitrogen, valve 65 is closed and valve 66 is opened permitting hydrogen to flow for an interval through the reaction chamber 44 by way of the same path as previously described for the flow of nitrogen. While the hydrogen is flowing, the switch 67 is closed and the voltage regulating control device 61 is adjusted to bring the strip 20 for a brief period to a temperature in the neighborhood of 2000° C. (centigrade). The voltage is then immediately reduced and the strip is permitted to cool. Next, the desired mixture of hydrogen and silicon tetrachloride vapor is obtained by adjusting the valves 58 and 59 after fully opening the valve 68. Opening the valve 58 permits a portion of the hydrogen gas to flow into the liquid silicon tetrachloride from whence it bubbles to the surface producing silicon tetrachloride vapor which, mixed with hydrogen, passes through the tube 60 and into the intake tube 57. At the same time a portion of the dry hydrogen passes through the valve 59 and the tube 56 directly into the intake tube 57 where it mixes with the hydrogen saturated with silicon tetrachloride vapor from the vessel 54 and enters the reaction chamber 44.

After the gaseous mixture has been flowing through the reaction chamber 44 long enough to become stabilized, the strip 20 is brought to and carefully maintained at the temperature (in the neighborhood of 1000° C.) at which it is most effective in decomposing the silicon tetrachloride vapor. As the decomposition proceeds, a coating of silicon forms on the strip 20 and the other products of the decomposition are withdrawn through the outlet pipe 62. After a sufficient coating of silicon has been deposited on the surface of the strip 20, the flow of the vapor mixture in the chamber is stopped and the temperature of the strip is raised for a short interval to a point where the deposited silicon fuses. The strip is then cooled permitting the silicon to crystallize.

The coated strip is removed from the reaction chamber 44.

In order to coat the tantalum wire 10 of Fig. 7 with silicon, the wire is suspended in the reaction chamber 44 and treated as above explained for the tantalum strip 20. Beads are formed on the tantalum wire 10 during the heating to fuse the deposited silicon before it is crystallized on cooling.

The coated tantalum strip 20 which has been removed from the reaction chamber 44 may now be coated with pure silicon by vaporization in vacuum by means of the apparatus illustrated in Fig. 11. The coated strip 20 is placed on insulating supports 70 and 71 projecting from the table or base plate 72. Plate 72 also contains similar supports 73 and 74 for another coated strip 75 which may be identical with strip 20 or it may be a coated tantalum wire, such as coated wire 10. A bell jar 76 is now placed on the surface of the plate 72 covering the strips 20 and 75 and the air is exhausted from the jar by means of a pump 77. A seal 78 of any suitable material serves to facilitate the exhaustion of the space within the bell jar 76.

The strip 20 may be heated electrically by current supplied by source 79 connected by switch 80 through voltage regulator 81 to the primary winding of transformer 82, the secondary winding of which may be connected to the ends of strip 20 by switch 83 and conductors 84 and 85. Similarly, strip 75 may be electrically heated by current supplied by source 79 when the secondary winding of the transformer 82 is connected to the ends of strip 75 by switch 86 and conductors 87 and 88. The deposition process is started by closing switch 86 to heat the strip 75 to a temperature above the vaporization of silicon. The vaporized, pure silicon deposits on the cooler crystallized silicon coating on strip 20. The temperature of strip 20 may be controlled, if desired, by closing switch 83 for very short periods of time.

The apparatus of Fig. 11 may also be used to form the layer 32 of silicon dioxide of the device of Fig. 6 by replacing the silicon-coated strip 75 of Fig. 11 with a strip coated with silicon dioxide or quartz and heating the strip to the vaporizing temperature of quartz.

A silicon-coated strip 20 may also be coated with silicon dioxide by passing a flame along the strip in air.

The bead 11 of tantalum wire 10 may be coated with silicon or silicon dioxide by vaporization in the same manner as explained for the silicon-coated strips with reference to Fig. 11.

What is claimed is:

1. A light-sensitive electric device comprising a support, a body of solidified fused purified silicon on said support, a thin film of amorphous silicon on said body, and electrical contacts contacting respectively said body of silicon and said thin film of silicon at points on their surfaces remote from each other.

2. A light-sensitive electric device comprising a support, a body of solidified fused purified silicon on said support, a thin film of silicon dioxide on said body of silicon, a thin film of amorphous silicon on said film of silicon dioxide, and electrical contacts contacting respectively said body of silicon and said thin film of silicon at points on their surfaces remote from each other.

3. A light-sensitive electric device comprising a metallic support, a body of solidified fused purified silicon on said support, a thin film of amorphous silicon on said body, a light transmitting layer of metal on said film of silicon, and an opaque metallic contactor connected to a portion only of the surface of said light transmitting layer.

4. A light-sensitive electric device comprising a metallic support, a body of solidified fused purified silicon on said support, a thin film of silicon dioxide on said body, a thin film of amorphous silicon on said film of silicon dioxide, a light transmitting layer of metal on said film of amorphous silicon, and on opaque metallic contactor connected to a portion only of the surface of said light transmitting metal layer.

5. The method of making a photo-E. M. F. cell which comprises supporting a metallic member in a reaction chamber, administering a gaseous mixture of hydrogen and silicon tetrachloride to said chamber, heating said metallic member to a temperature between 1000° C. and 1250° C. to effect the decomposition of said silicon tetrachloride and the deposition of a layer of highly pure silicon on said member, heating said member to a higher temperature to fuse the silicon of said layer, cooling said member to solidify and crystallize the silicon of said layer, coating said crystalline silicon by vaporization with additional silicon under conditions to form an amorphous layer of silicon on a portion of the surface of said crystalline silicon, and providing a light-transmitting electrical contact on said layer of amorphous silicon.

6. The method of making a photo-E. M. F. cell which comprises supporting a metallic member in a reaction chamber, administering a gaseous mixture of hydrogen and silicon tetrachloride to said chamber, heating said metallic member to a temperature between 1000° C. and 1250° C. to effect the decomposition of said silicon tetrachloride and the deposition of a layer of highly pure silicon on said member, heating said member to a higher temperature to fuse the silicon of said layer, cooling said member to solidify and crystallize said silicon, coating said crystalline silicon with a layer of silicon dioxide, coating said layer of silicon dioxide by vaporization with additional silicon under conditions to form an amorphous layer of silicon thereon, and providing a light-transmitting electrical contact on said layer of amorphous silicon.

7. A light-sensitive electric device comprising a semiconductor, a layer of amorphous silicon on said semiconductor, a light transmitting film consisting of substantially pure tungsten between 3 and 8 ten-thousandths of a mil thick overlying a portion of said layer, and electrical contacts contacting said semiconductor and said tungsten film respectively.

8. A light sensitive electric device comprising a body of solidified fused purified silicon, a film of silicon dioxide on a portion of the surface of said body, a film of tungsten on said first film, and electrical conductors contacting respectively said body and said film of tungsten on portions of their surfaces remote from each other.

9. A light sensitive electric device comprising a body of solidified fused purified silicon, a film of amorphous silicon on a portion of the surface of said body, a film of tungsten on said first film, and electrical conductors contacting respectively said body and said film of tungsten on portions of their surfaces remote from each other.

WALTER H. BRATTAIN.

REFERENCES CITED

The following references are of record in the file of this patent:

UNITED STATES PATENTS

| Number | Name | Date |
|---|---|---|
| 448,915 | Erlwein | Mar. 24, 1891 |
| 553,296 | Aylesworth | Jan. 21, 1896 |
| 836,531 | Pickard | Nov. 20, 1906 |
| 876,332 | Clark | Jan. 14, 1908 |
| 1,964,322 | Hyde | June 26, 1934 |
| 1,998,334 | Rupp | Apr. 16, 1935 |
| 2,061,357 | Heyroth et al. | Nov. 17, 1936 |
| 2,402,662 | Ohl | June 25, 1946 |
| 2,423,125 | Teal | July 1, 1947 |
| 2,443,542 | Ohl | June 15, 1948 |

FOREIGN PATENTS

| Number | Country | Date |
|---|---|---|
| 488,244 | Great Britain | July 4, 1938 |